(12) United States Patent
Takenouchi

(10) Patent No.: US 10,283,410 B2
(45) Date of Patent: May 7, 2019

(54) METHOD OF PROCESSING WORKPIECE

(71) Applicant: DISCO CORPORATION, Tokyo (JP)

(72) Inventor: Kenji Takenouchi, Tokyo (JP)

(73) Assignee: Disco Corporation, Tokyo (JP)

( * ) Notice: Subject to any disclaimer, the term of this patent is extended or adjusted under 35 U.S.C. 154(b) by 0 days.

(21) Appl. No.: 15/971,592

(22) Filed: May 4, 2018

(65) Prior Publication Data

US 2018/0330990 A1 Nov. 15, 2018

(30) Foreign Application Priority Data

May 9, 2017 (JP) ................. 2017-092985

(51) Int. Cl.
*H01L 21/00* (2006.01)
*H01L 21/78* (2006.01)
*H01L 21/304* (2006.01)
*H01L 21/683* (2006.01)

(52) U.S. Cl.
CPC ............ *H01L 21/78* (2013.01); *H01L 21/304* (2013.01); *H01L 21/3043* (2013.01); *H01L 21/6836* (2013.01); *H01L 2221/68327* (2013.01)

(58) Field of Classification Search
CPC .................. H01L 21/78; H01L 21/3043; H01L 21/67092; H01L 21/3212; H01L 21/6836; H01L 2221/68327; H01L 22/32; H01L 21/68714; H01L 21/68785; H01L 21/268; H01L 21/2686; H01L 21/304; H01L 21/30625; H01L 21/3065; H01L 21/308; H01L 21/31138; H01L 21/31144; H01L 21/67069; H01L 21/6833; H01L 21/68728; H01L 2221/6834; H01L 23/3114; B28D 5/022; B28D 5/047; B28D 5/00; B28D 5/0029; B28D 5/0076; B28D 5/0094; B28D 5/023; B28D 7/02; C09G 1/02
See application file for complete search history.

(56) References Cited

FOREIGN PATENT DOCUMENTS

JP 2006041261 A 2/2006

*Primary Examiner* — Robert G Bachner
(74) *Attorney, Agent, or Firm* — Greer Burns & Crain Ltd.

(57) ABSTRACT

A method of processing a workpiece with a cutting blade, the workpiece having a body of metal disposed in superposed relation to projected dicing lines, including: a first metal burr removing step of moving the cutting blade through first cut grooves while the cutting blade is positioned at such a height that a lowermost end of the cutting blade is lower than an upper end of the body of metal; and a second metal burr removing step of moving the cutting blade through the second cut grooves while the cutting blade is positioned at such a height that the lowermost end of the cutting blade is lower than the upper end of the body of metal. A liquid containing an organic acid and an oxidizing agent is supplied to the workpiece in the first metal burr removing step and the second metal burr removing step.

4 Claims, 3 Drawing Sheets

METHOD OF PROCESSING WORKPIECE

BACKGROUND OF THE INVENTION

Field of the Invention

The present invention relates to a method of processing a workpiece having a plurality of intersecting projected dicing lines set thereon and a body of metal disposed in superposed relation to the projected dicing lines.

Description of the Related Art

There is known a cutting apparatus for cutting workpieces such as semiconductor wafers, packaged substrates, ceramics substrates, glass substrates, etc. accurately with an annular cutting blade. In the cutting apparatus, the cutting blade is rotatably supported on a spindle. The cutting blade is rotated about its own axis and moved to cut into a workpiece to cut the workpiece. The workpiece has a grid of intersecting projected dicing lines on a face side thereof that demarcate the face side into a plurality of areas where devices such as integrated circuits (ICs), large-scale integration (LSI) circuits, etc. are formed. When the workpiece is cut along the projected dicing lines, it is divided into a plurality of chips having the devices disposed thereon, hereinafter referred to as device chips.

Prior to being cut, the workpiece may have a layer containing metal as a material of the devices, wiring, or test element group (TEG), and the layer may be disposed at positions superposed on the projected dicing lines. In case the layer is disposed at positions superposed on the projected dicing lines, the cutting blade cuts the layer when it cuts the workpiece. When the cutting blade cuts the layer in cutting the workpiece, the metal contained in the layer is elongated by the rotating cutting blade, tending to give rise to protrusions, hereinafter referred to as metal burrs extending from the layer containing the metal due to contact with the cutting blade. If the metal burrs are formed, they may contact another nearby layer containing metal, possibly causing a short circuit, or they may come off, possibly damaging device chips. Furthermore, if metal burrs remain on device chips that have been formed, then problems such as a bonding failure may occur when the device chips are installed on given objects.

Accordingly, it is necessary to remove such metal burrs. There has been proposed a technology for removing metal burrs from a workpiece by moving a rotating cutting blade again through a cut groove that has been formed in the workpiece by the cutting blade. Particularly in the vicinity of an intersection of projected dicing lines, when the cutting blade is moved through one of the projected dicing lines, produced metal burrs tend to be deformed toward the other projected dicing line so as to avoid the cutting blade. Therefore, it is not easy to remove the metal burrs. There has also been proposed a technology for removing metal burrs in the vicinity of an intersection of projected dicing lines (see Japanese Patent Laid-Open No. 2006-41261).

SUMMARY OF THE INVENTION

However, there are cases where even the latter proposed technology fails to fully remove metal burrs in the vicinity of an intersection of projected dicing lines. Metal burrs are malleable. When the cutting blade is moved through one of the projected dicing lines across the intersection, the metal burrs are elongated toward the other projected dicing line, and some of the metal burrs are liable to remain in the vicinity of the intersection.

It is therefore an object of the present invention to provide a method of processing a workpiece with a grid of intersection projected dicing lines thereon to easily remove metal burrs that have been produced in the vicinity of an intersection of projected dicing lines when the workpiece is cut by a cutting blade along the projected dicing lines.

In accordance with an aspect of the present invention, there is provided a method of processing a workpiece with a rotating annular cutting blade, the workpiece having projected dicing lines set thereon which include a plurality of first projected dicing lines extending in a first direction and a plurality of second projected dicing lines extending in a second direction that lies transversely to the first direction, the workpiece also having a body of metal disposed in superposed relation to the projected dicing lines. The processing method includes: a tape sticking step of sticking a tape to the workpiece; after the tape sticking step is carried out, a holding step of holding the workpiece on a holding table with the tape interposed therebetween; after the holding step is carried out, a first cutting step of cutting the workpiece along the first projected dicing lines with the cutting blade while cutting into the tape, thereby to form first cut grooves in the workpiece; after the first cutting step is carried out, a second cutting step of cutting the workpiece along the second projected dicing lines with the cutting blade while cutting into the tape, thereby to form second cut grooves in the workpiece; after the second cutting step is carried out, a first metal burr removing step of moving the cutting blade through the first cut grooves while the cutting blade is positioned at such a height that a lowermost end of the cutting blade is lower than an upper end of the body of metal, thereby to remove metal burrs from the first cut grooves; and after the second cutting step is carried out, a second metal burr removing step of moving the cutting blade through the second cut grooves while the cutting blade is positioned at such a height that the lowermost end of the cutting blade is lower than the upper end of the body of metal, thereby to remove metal burrs from the second cut grooves. A liquid containing an organic acid and an oxidizing agent is supplied to the workpiece in the first metal burr removing step and the second metal burr removing step.

Preferably, the processing method further includes: after the first metal burr removing step and the second metal burr removing step are carried out, a first tape burr removing step of moving the cutting blade through the first cut grooves thereby to remove tape burrs produced from the tape; and after the first metal burr removing step and the second metal burr removing step are carried out, a second tape burr removing step of moving the cutting blade through the second cut grooves thereby to remove tape burrs produced from the tape. In the first cutting step, the second cutting step, the first metal burr removing step, and the second metal burr removing step, a direction in which a lowermost end of the cutting blade upon rotation thereof is in agreement with a direction in which the workpiece is fed. In the first tape burr removing step and the second tape burr removing step, the direction in which the lowermost end of the cutting blade upon rotation thereof is opposite the direction in which the workpiece is fed.

Further preferably, the workpiece may be fed at a higher rate in the first metal burr removing step and the second metal burr removing step, than in the first cutting step and the second cutting step. A liquid containing an organic acid and an oxidizing agent is supplied to the workpiece in the first cutting step and the second cutting step.

When the first cutting step of cutting the workpiece along the first projected dicing lines thereby to form first cut grooves in the workpiece and the second cutting step of cutting the workpiece along the second projected dicing lines thereby to form second cut grooves in the workpiece are carried out, metal burrs are produced from a layer containing metal disposed in superposed relation to the projected dicing lines. It is not easy to remove metal burrs that occur in the vicinity of intersections of the first projected dicing lines extending in the first direction and the second projected dicing lines extending in the second direction. According to the aspect of the present invention, after the workpiece is cut by the cutting blade, the cutting blade is moved through the cut grooves formed in the workpiece while a liquid containing an organic acid and an oxidizing agent is being supplied to the workpiece. The organic acid contained in the liquid modifies the metal of the metal burrs to make themselves less malleable, and the oxidizing agent contained in the liquid changes the quality of films on the surfaces of the metal burrs to make the metal burrs lose malleability. Since the metal burrs become less liable to extend, when the cutting blade is moved through the cut grooves, the metal burrs that occur in the intersections can appropriately be removed therefrom.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1:
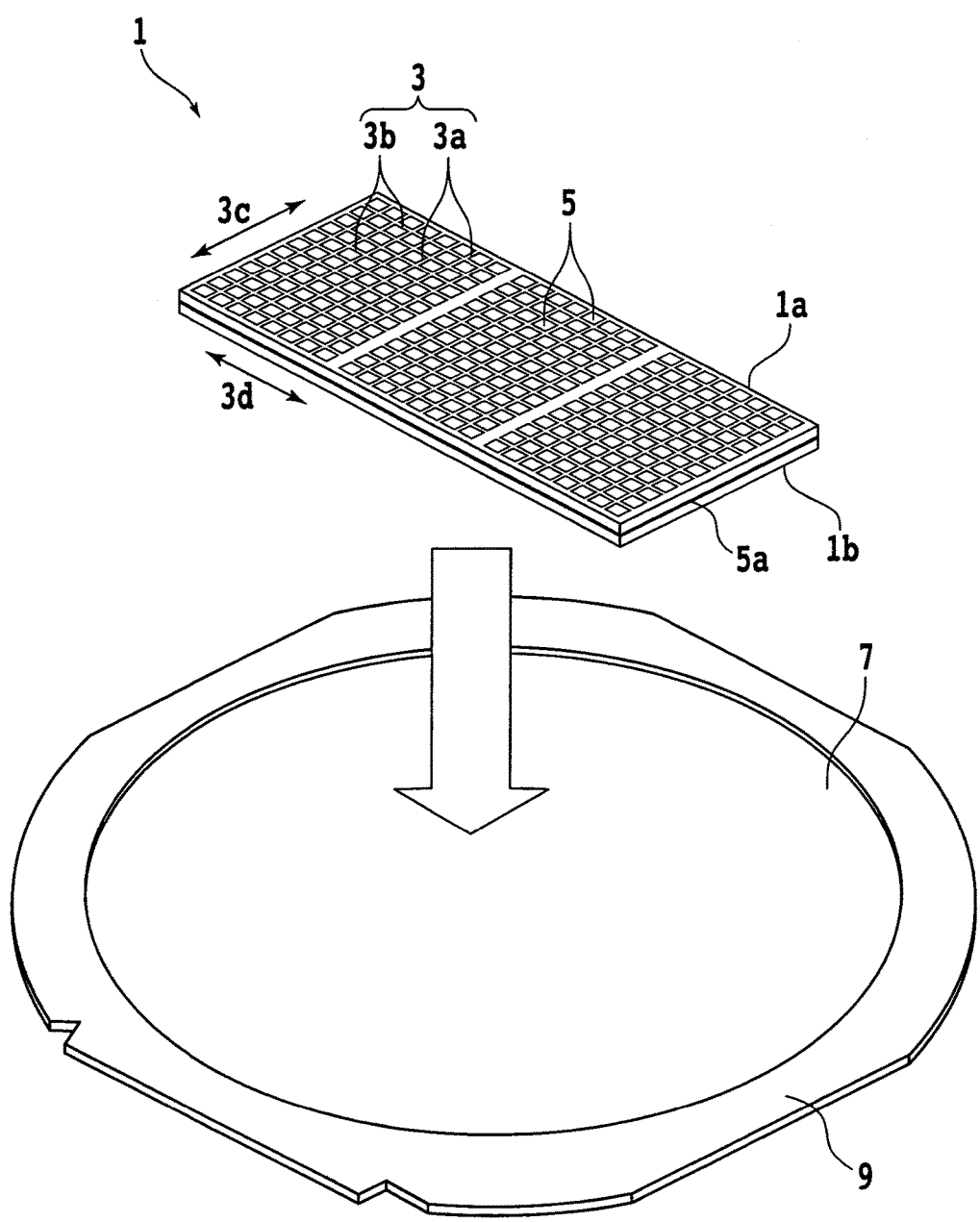
FIG. 1 is a perspective view schematically showing a tape sticking step.

First, a workpiece to be processed by a method of processing a workpiece according to an embodiment of the present invention will be described below. The workpiece is a package substrate having a plurality of devices such as ICs, LSI circuits, etc., which are covered with a sealing resin. Alternatively, the workpiece may be a semiconductor wafer made of silicon, sapphire, or the like, for example, or may be a substrate made of glass, quartz, resin, or the like. FIG. 1 shows in perspective a package substrate as a workpiece 1 in its upper section. The workpiece 1 has a plurality of projected dicing lines 3, also referred to as streets, set on a surface thereof which include a plurality of first projected dicing lines 3a extending along a first direction 3c and a plurality of second projected dicing lines 3b extending along a second direction 3d that lies transversely to the first direction 3c. The projected dicing lines 3 demarcate the surface of the workpiece 1 into a plurality of areas in which devices 5 such as ICs, LSI circuits, etc. are formed. The workpiece 1 is cut and divided along the projected dicing lines 3 into individual device chips that carry the devices 5 thereon.

The workpiece 1 also includes a layer 5a containing metal substantially centrally therein in a thicknesswise direction thereof. The layer 5a containing metal may be a wiring layer, for example. Alternatively, the layer 5a containing metal may be incorporated in the devices 5, test element group (TEG), or the like. If the layer 5a containing metal is formed in superposed relation to the projected dicing lines 3, then when the workpiece 1 is cut along the projected dicing lines 3, metal burrs are produced which extend from the layer 5a containing metal.

In the method of processing a workpiece according to the present embodiment, a tape is stuck to the workpiece 1. The tape will be described below with reference to FIG. 1. FIG. 1 schematically shows in perspective a tape 7 applied to a frame 9 made of metal or the like in its lower section. The tape 7 has a function to protect the workpiece 1 against shocks imposed during various steps to prevent the workpiece 1 from being damaged while the method of processing a workpiece according to the present embodiment is being performed on the workpiece 1. The tape 7 applied to the frame 9 also makes it easy to transport the workpiece 1. The tape 7 may not be applied to the frame 9, and the tape 7 not applied to the frame 9 may be of the same size as the workpiece 1 and may be stuck to the workpiece 1. The tape 7 has a flexible film-like base and a glue layer (adhesive layer) formed on one surface of the base. The base may be made of polyolefin (PO), polyethylene terephthalate (PET), polyvinyl chloride, polystyrene, or the like, for example. The glue layer (adhesive layer) may be made of silicone rubber, acrylic material, epoxy material, or the like, for example.

Figure 2A:
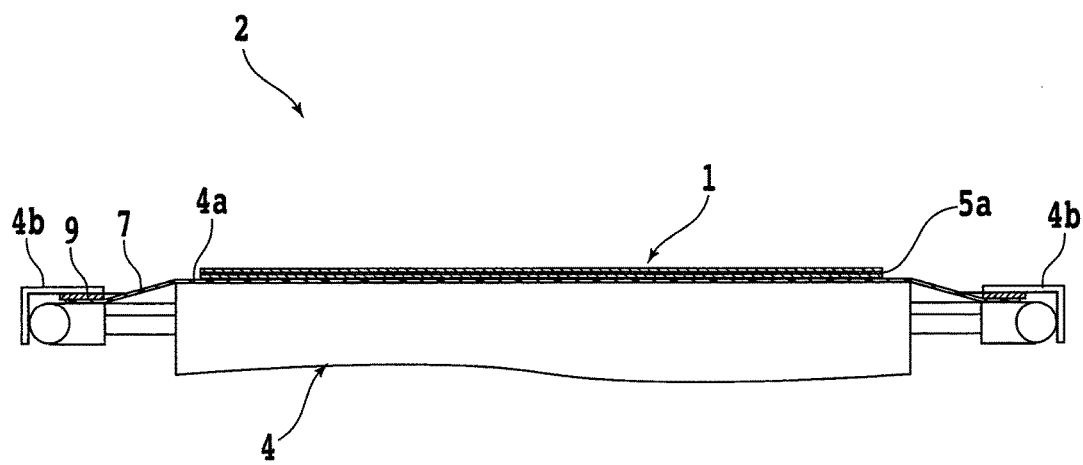
FIG. 2A is a cross-sectional view schematically showing a holding step.
Figure 2B:
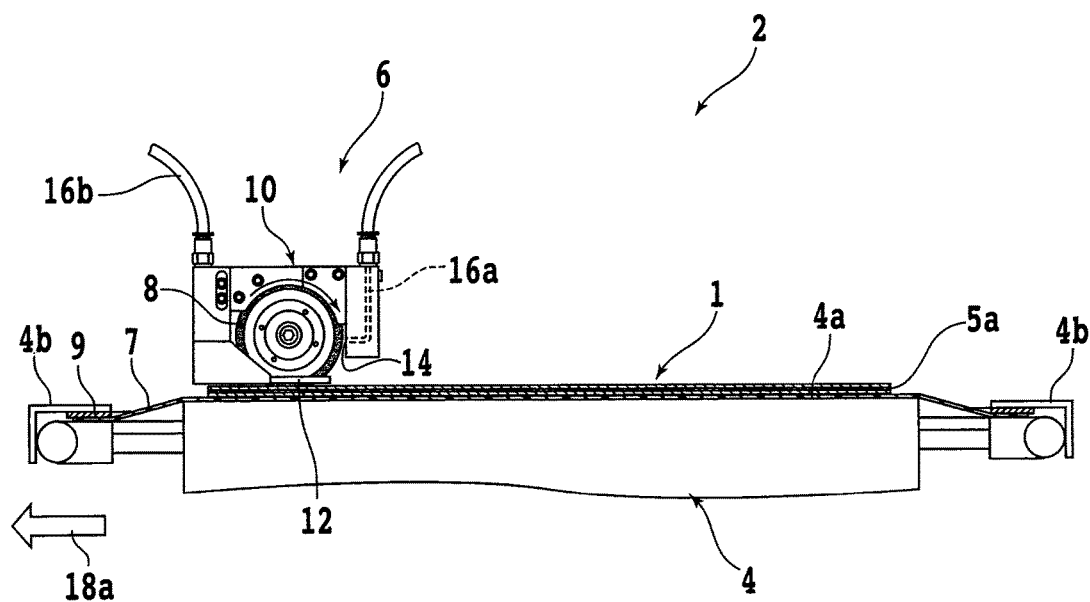
FIG. 2B is a cross-sectional view schematically showing a first cutting step and a second cutting step.

A cutting apparatus used in the method of processing a workpiece according to the present embodiment will be described below with reference to FIG. 2B. FIG. 2B schematically shows the cutting apparatus, denoted by 2. The cutting apparatus 2 includes a holding table 4, also referred to as chuck table, for holding the workpiece 1 thereon and a cutting unit 6 for cutting the workpiece 1 held on the holding table 4. The holding table 4 has a porous member, not shown, on its upper surface. The porous member has an upper surface serving as a holding surface 4a for holding the workpiece 1 thereon. The holding table 4 has a suction channel defined therein which has one end connected to a suction source, not shown, in the holding table 4, and another end connected to the porous material. A plurality of clamps 4b for gripping the frame 9 are mounted on an outer circumferential surface of the holding table 4. The workpiece 1 is placed on the holding surface 4a with the tape 7 interposed therebetween, and the frame 9 attached to the tape 7 is fixed in place by the clamps 4b. The workpiece 1 is held under suction on the holding table 4 when a negative pressure produced by the suction source is applied through the pores in the porous member to the workpiece 1.

The cutting apparatus 2 has a processing-feed mechanism, not shown, powered by a stepping motor or the like, for moving the holding table 4 in a processing-feed direction, e.g., the direction indicated by the arrow 18a in FIG. 2B, of the cutting apparatus 2. For cutting the workpiece 1, the processing-feed mechanism moves the holding table 4 in the direction indicated by the arrow 18a thereby to processing-feed the workpiece 1. The cutting apparatus 2 also has an indexing-feed mechanism, not shown, powered by a stepping motor or the like, for moving the holding table 4 in an indexing-feed direction, not shown, of the cutting apparatus 2. The holding table 4 is also rotatable about an axis substantially perpendicular to the holding surface 4a. When the holding table 4 is rotated about the axis, the processing-feed direction for the workpiece 1 is changed.

The cutting unit 6 includes a rotatably supported spindle and a cutting blade 8 that is rotatable about its own axis by the spindle. The cutting blade 8 is a washer-type blade, for example, in the form of an annular grinding stone made of abrasive grains bound by metal or resin. The cutting blade 8 has a through hole defined centrally therein. The cutting blade 8 is sandwiched between a front flange and a rear flange and fixedly mounted on a tip end of the spindle. The cutting blade 8 is surrounded by a blade cover 10 to which there are fixed a pair of cutting fluid supply nozzles 12 disposed respectively on the face and reverse sides of the cutting blade 8. The blade cover 10 also has a cutting fluid ejection port 14 defined therein which is open to an outer circumferential surface of the annular cutting blade 8 and directed toward the cutting blade 8. The cutting fluid supply nozzles 12 and the cutting fluid ejection port 14 are connected to respective ends of cutting fluid supply pipes (cutting fluid supply passages) 16a and 16b, whose other ends are connected to a cutting fluid supply source, not shown.

For cutting the workpiece 1 with the cutting blade 8, the cutting fluid supply nozzles 12 and the cutting fluid ejection port 14 supply a cutting fluid to the cutting blade 8 that is rotating about its axis. The cutting fluid is then supplied to a processing point on the workpiece 1 where the cutting blade 8 is kept in contact with the workpiece 1. The cutting fluid is a liquid containing an organic acid and an oxidizing agent, or pure water, or the like. The cutting fluid can be supplied to the workpiece 1 at times other than when the workpiece 1 is cut by the cutting blade 8. As the organic acid referred to above, there can be used a compound having at least one carboxyl group and at least one amino group in its molecule. At least one of the amino group(s) should preferably be a secondary or tertiary amino group. In addition, the compound used as the organic acid may have a substituent group.

Amino acids that can be used as the organic acid include glycine, dihydroxyethylglycine, glycylglycine, hydroxyethylglycine, N-methylglycine, β-alanine, L-alanine, L-2-aminobutyric acid, L-norvaline, L-valine, L-leucine, L-norleucine, L-alloisoleucine, L-isoleucine, L-phenylalanine, L-proline, sarcosine, L-ornithine, L-lysine, taurine, L-serine, L-threonine, L-allothreonine, L-homoserine, L-thyroxine, L-tyrosine, 3,5-diiodo-L-tyrosine, β-(3,4-dihydroxyphenyl)-L-alanine, 4-hydroxy-L-proline, L-cysteine, L-methionine, L-ethionine, L-lanthionine, L-cystathionine, L-cystine, L-cystic acid, L-glutamic acid, L-aspartic acid, S-(carboxymethyl)-L-cysteine, 4-aminobutyric acid, L-asparagine, L-glutamine, azaserine, L-canavanine, L-citrulline, L-arginine, δ-hydroxy-L-lysine, creatine, L-kynurenine, L-histidine, 1-methyl-L-histidine, 3-methyl-L-histidine, L-tryptophane, actinomycin C1, ergothioneine, apamin, angiotensin I, angiotensin II, antipain, etc. Among others, particularly preferred are glycine, L-alanine, L-proline, L-histidine, L-lysine, and dihydroxyethylglycine.

Furthermore, amino polyacids that can be used as the organic acid include iminodiacetic acid, nitrilotriacetic acid, diethylenetriaminepentaacetic acid, ethylenediaminetetraacetic acid, hydroxyethyliminodiacetic acid, nitrilotrismethylenephosphonic acid, ethylenediamine-N,N,N',N'-tetramethylenesulfonic acid, 1,2-diaminopropanetetraacetic acid, glycol ether diaminetetraacetic acid, transcyclohexanediaminetetraacetic acid, ethylenediamineorthohydroxyphenylacetic acid, ethylenediaminedisuccinic acid (SS isomer), β-alaninediacetic acid, N-(2-carboxylatoethyl)-L-aspartic acid, N,N'-bis(2-hydroxybenzyl)ethylenediamine-N,N'-diacetic acid, etc.

Moreover, carboxylic acids that can be used as the organic acid include saturated carboxylic acids such as formic acid, glycolic acid, propionic acid, acetic acid, butyric acid, valeric acid, hexanoic acid, oxalic acid, malonic acid, glutaric acid, adipic acid, malic acid, succinic acid, pimelic acid, mercaptoacetic acid, glyoxylic acid, chloroacetic acid, pyruvic acid, acetoacetic acid, glutaric acid, etc., unsaturated carboxylic acids such as acrylic acid, methacrylic acid, crotonic acid, fumaric acid, maleic acid, mesaconic acid, citraconic acid, aconitic acid, etc., and cyclic unsaturated carboxylic acids such as benzoic acid, toluic acid, phthalic acid, naphthoic acid, pyromellitic acid, naphthalic acid, etc. As the oxidizing agent contained in the cutting fluid, there can be used, for example, hydrogen peroxide, peroxides, nitrates, iodates, periodates, hypochlorites, chlorites, chlorates, perchlorates, persulfates, dichromates, permanganate, cerates, vanadates, ozonated water, silver(II) salts, iron(III) salts, and their organic complex salts.

The method of processing a workpiece, also referred to as processing method, according to the present embodiment will be described below. The processing method is performed using the cutting apparatus 2. In the processing method, the tape 7 is stuck to the workpiece 1, and the workpiece 1 is held on the holding table 4 with the tape 7 interposed therebetween. Thereafter, the cutting blade 8 cuts the workpiece 1 along the projected dicing lines 3, forming cut grooves in the workpiece 1. The cutting blade 8 is moved through the cut grooves, removing metal burrs. The steps of the processing method will be described in detail below. In the processing method according to the present embodiment, a tape sticking step is carried out first. The tape sticking step will be described below with reference to FIG. 1. FIG. 1 is a perspective view schematically showing the tape sticking step. In the tape sticking step, the workpiece 1 with its reverse side 1b facing downwardly is lowered from above the tape 7 that has been applied to the frame 9 with its adhesive surface (glue layer) facing upwardly. Then, the tape 7 is stuck to the workpiece 1.

After the tape sticking step is carried out, a holding step is carried out. FIG. 2A is a cross-sectional view schematically showing the holding step. FIG. 2A schematically shows the frame 9, the tape 7, and the workpiece 1 in cross section. In the holding step, the workpiece 1 is placed on the holding surface 4a of the holding table 4 with the tape 7 interposed therebetween, and the frame 9 is fixed in place by the clamps 4b. Then, the suction source in the holding table 4 is actuated to apply a negative pressure through the suction channel in the holding table 4 and the pores in the porous member to the workpiece 1, thereby holding the workpiece 1 under suction on the holding table 4.

The holding step is followed by a first cutting step to cut the workpiece 1 along the first projected dicing lines 3a to form first cut grooves in the workpiece 1 along the first projected dicing lines 3a. In the first cutting step, first, the holding table 4 is moved so that the cutting blade 8 can cut the workpiece 1 along the first projected dicing lines 3a. Specifically, the cutting blade 8 is positioned above an extension of one of the first projected dicing lines 3a. Then, the cutting blade 8 is lowered to a height at which it can cut into the tape 7 so that the cutting blade 8 can divide the workpiece 1 along the first projected dicing line 3a. At the same time, the spindle is rotated about its own axis to start rotating the cutting blade 8, and the cutting fluid supply nozzles 12 and the cutting fluid ejection port 14 supply the cutting fluid to the cutting blade 8. The cutting fluid is a liquid containing an organic acid and an oxidizing agent, or pure water.

Then, the holding table 4 is moved to processing-feed the workpiece 1, and the rotating cutting blade 8 is brought into contact with the workpiece 1, starting to perform a cutting process to cut the workpiece 1. The cutting blade 8 cuts the workpiece 1 along the first projected dicing line 3a, forming a first cut groove in the workpiece 1 along the first projected dicing line 3a, whereupon the workpiece 1 is divided. After the workpiece 1 has been cut along the first projected dicing line 3a, the cutting blade 8 is lifted, and the workpiece 1 is indexing-fed to bring a next one of the first projected dicing lines 3a into alignment with the cutting blade 8. The cutting blade 8 then cuts the workpiece 1 along the next first projected dicing line 3a in the manner described above. The above cutting process is repeated to cut the workpiece 1 along all the first projected dicing lines 3a that extend along the first direction 3c, forming cut grooves in the workpiece 1 along all the first projected dicing lines 3a, whereupon the first cutting step is completed.

The first cutting step is followed by a second cutting step to cut the workpiece 1 along the second projected dicing lines 3b to form second cut grooves in the workpiece 1 along the second projected dicing lines 3b. In the second cutting step, first, the holding table 4 is turned about the axis substantially perpendicular to the holding surface 4a, changing the processing-feed direction for the workpiece 1 to a direction along the second direction 3d. Then, the cutting blade 8 cuts the workpiece 1 along all the second projected dicing lines 3b extending along the second direction 3d in the same manner as with the first cutting step. Now, second cut grooves are formed in the workpiece 1 along all the second projected dicing lines 3b. When the first cutting step and the second cutting step are thus carried out, the layer 5a containing metal disposed in superposed relation to the projected dicing lines 3 is cut by the cutting blade 8. When the layer 5a containing metal is cut by the cutting blade 8, metal burrs extending from the layer 5a containing metal are produced and may cause various problems.

In the first cutting step and the second cutting step, if a liquid containing an organic acid and an oxidizing agent is used as the cutting fluid, then it can restrain the occurrence of metal burrs extending in thicknesswise directions of the workpiece 1. However, there are cases in which metal burrs may be produced from the layer 5a containing metal even if a liquid containing an organic acid and an oxidizing agent is used as the cutting fluid. The metal burrs have a tendency to extend longer as the processing-feed rate for the workpiece 1 is higher. If water is used as the cutting fluid, for example, the cutting process needs to be performed at a processing-feed rate of 5 mm/second or lower. Meanwhile, if a liquid containing an organic acid and an oxidizing agent is used as the cutting fluid, then as metal burrs are prevented from extending, the cutting process can be performed at a processing-feed rate of approximately 100 mm/second for increased processing efficiency.

The second cutting step is followed by a first metal burr removing step to remove metal burrs produced in the first cut grooves by moving the cutting blade 8 through the first cut grooves. In the first metal burr removing step, the cutting blade 8 is positioned at such a height that the lowermost end of the cutting blade 8 is lower than the layer 5a containing metal. Then, the cutting blade 8 is moved through the first cut grooves to remove the metal burrs therefrom. The second cutting step is also followed by a second metal burr removing step to remove metal burrs produced in the second cut grooves by moving the cutting blade 8 through the second cut grooves. In the second metal burr removing step, the cutting blade 8 is positioned at such a height that the lowermost end of the cutting blade 8 is lower than the layer 5a containing metal. Then, the cutting blade 8 is moved through the second cut grooves to remove the metal burrs therefrom.

Figure 3A:
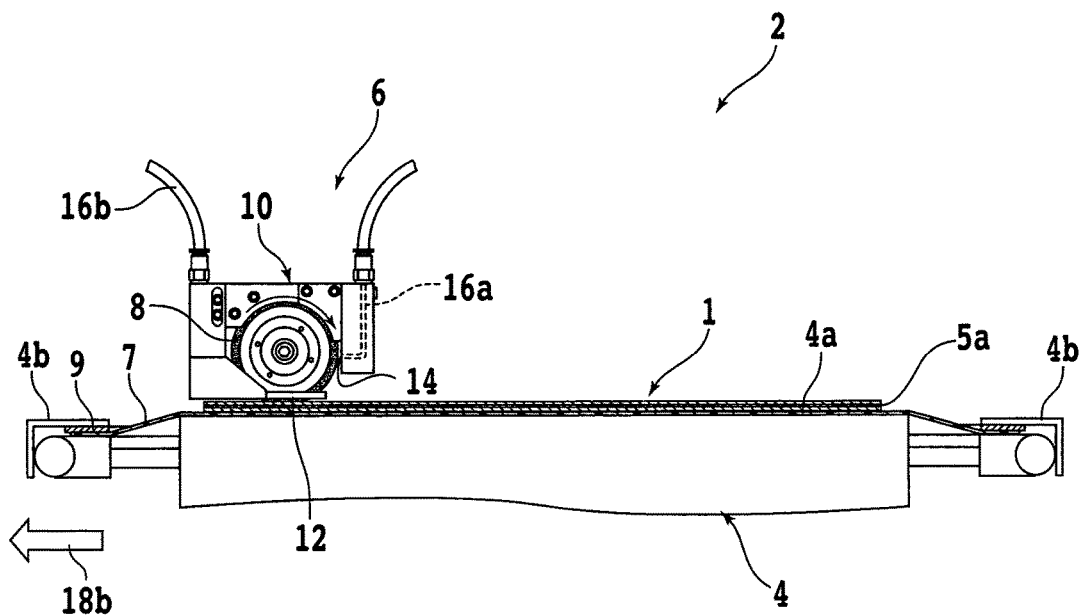
FIG. 3A is a cross-sectional view schematically showing a first metal burr removing step and a second metal burr removing step.

In the first metal burr removing step and the second metal burr removing step, the cutting blade 8 may not be positioned at such a height that the lowermost end of the cutting blade 8 is lower than the layer 5a containing metal. When the cutting blade 8 is moved through a cut groove, it removes not only metal burrs existing in an area through which the cutting blade 8 passes, but also part of metal burrs existing beneath such the area. Consequently, in some cases, all metal burrs may be removed providing the cutting blade 8 is positioned at such a height that the lowermost end of the cutting blade 8 is lower than an upper end of the layer 5a containing metal. FIG. 3A is a cross-sectional view schematically showing the first metal burr removing step and the second metal burr removing step. As shown in FIG. 3A, in the first metal burr removing step and the second metal burr removing step, the direction in which the lowermost end of the cutting blade 8 is moved upon rotation thereof is in agreement with the direction indicated by the arrow 18b in which the holding table 4 is fed.

If a liquid containing an organic acid and an oxidizing agent is not supplied to the workpiece 1 in the first metal burr removing step and the second metal burr removing step, then it is not easy to fully remove the metal burrs even when the cutting blade 8 is moved through the first cut grooves or the second cut grooves. In particular, it is difficult to fully remove the metal burrs that are malleable in the vicinity of intersections of the first cut grooves or the second cut grooves. Specifically, when the cutting blade 8 is moved through the first cut grooves, the metal burrs that exist in the vicinity of the intersections are elongated toward the second cut grooves, and when the cutting blade 8 is moved through the second cut grooves, the metal burrs that exist in the vicinity of the intersections are elongated toward the first cut grooves. Since the metal burrs are malleable, the metal burrs are not likely to be fully removed simply by moving the cutting blade 8 through the cut grooves. Consequently, in the first metal burr removing step and the second metal burr removing step, the workpiece 1 is supplied with a liquid containing an organic acid and an oxidizing agent. The organic acid contained in the liquid modifies the metal of the metal burrs to make itself less malleable, and the oxidizing agent contained in the liquid changes the quality of films on the surfaces of the metal burrs to make the metal burrs lose malleability. Therefore, when the cutting blade 8 is moved through the cut grooves, since the metal burrs do not extend so as to avoid the cutting blade 8 because they are rendered less malleable, the metal burrs are likely to be removed by the cutting blade 8.

In the first metal burr removing step and the second metal burr removing step, the holding table 4 is moved at a feed rate of approximately 500 mm/second, for example. In the first metal burr removing step and the second metal burr removing step, unlike the first cutting step and the second cutting step, the cutting blade 8 does not cut the workpiece 1. Therefore, the feed rate of the holding table 4 can be higher. The higher feed rate of the holding table 4 increases the efficiency with which to process the workpiece 1. If the layer 5a containing metal is included in the workpiece 1 at a height near the reverse side 1b of the workpiece 1 or on the reverse side 1b of the workpiece 1, then the cutting blade 8 that is positioned at a height capable of removing the metal burrs may cut the tape 7 when it is cutting the workpiece 1. Particularly, if the cutting blade 8 cuts the tape 7 while the feed rate of the holding table 4 is high, then the tape 7 may produce tape burrs. Therefore, after the first metal burr removing step and the second metal burr removing step are carried out, a first tape burr removing step is carried out to remove tape burrs by moving the cutting blade 8 through the first cut grooves, and a second tape burr removing step is carried out to remove tape burrs by moving the cutting blade 8 through the second cut grooves.

Figure 3B:
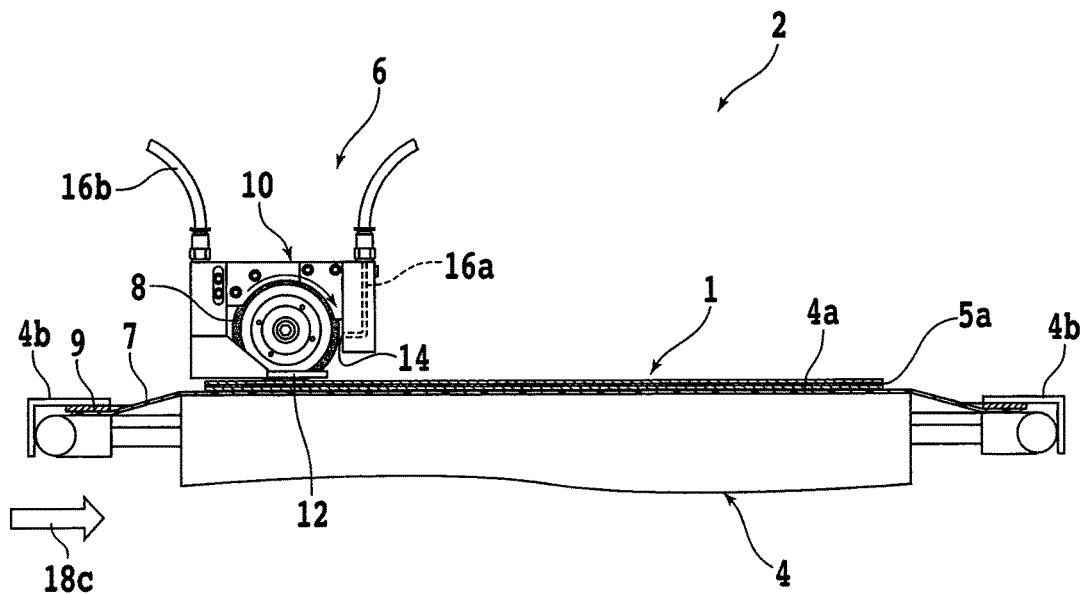
FIG. 3B is a cross-sectional view schematically showing a first tape burr removing step and a second tape burr removing step.

FIG. 3B is a cross-sectional view schematically showing the first tape burr removing step and the second tape burr removing step. As shown in FIG. 3B, in the first tape burr removing step and the second tape burr removing step, the direction in which the lowermost end of the cutting blade 8 moves upon rotation thereof is opposite the direction indicated by the arrow 18c in which the workpiece 1 is fed. While the tape burrs are being removed, the workpiece 1 may be supplied with pure water or tap water. In the first tape burr removing step and the second tape burr removing step, the cutting blade 8 may be positioned at such a height that the lowermost point of the cutting blade 8 can reach the tape 7 so as to be able to reliably remove the produced tape burrs. In the first tape burr removing step and the second tape burr removing step, the holding table 4 is moved at a feed rate of approximately 500 mm/second, for example. In the first tape burr removing step and the second tape burr removing step, unlike the first cutting step and the second cutting step, the cutting blade 8 does not cut the workpiece 1. Therefore, the feed rate of the holding table 4 can be higher. The higher feed rate of the holding table 4 increases the efficiency with which to process the workpiece 1.

When the processing method according to the present embodiment is performed, the workpiece 1 is divided along the projected dicing lines 3, producing individual device chips. According to the processing method, inasmuch as a liquid containing an organic acid and an oxidizing agent is used upon removal of metal burrs produced in the cutting process, the malleability of the metal burrs is restrained for effectively removing the metal burrs.

The present invention is not limited to the description of the above embodiment, but various changes and modifications may be made therein. For example, according to the above embodiment, the first tape burr removing step and the second tape burr removing step are carried out after the first metal burr removing step and the second metal burr removing step are carried out. However, the present invention is not limited to such a sequence of steps. The first tape burr removing step may be carried out after the first metal burr removing step is carried out, and then the second tape burr removing step may be carried out after the second metal burr removing step is carried out. Furthermore, the metal burr removing step may be carried out on one projected dicing line 3 by feeding the workpiece 1 in a predetermined direction, and thereafter the tape burr removing step may be carried out on the same projected dicing line 3 by feeding the workpiece 1 in a direction opposite the predetermined direction.

The present invention is not limited to the details of the above described preferred embodiment. The scope of the invention is defined by the appended claims and all changes and modifications as fall within the equivalence of the scope of the claim are therefore to be embraced by the invention.

What is claimed is:

1. A method of processing a workpiece with a rotating annular cutting blade, the workpiece having projected dicing lines set thereon which include a plurality of first projected dicing lines extending in a first direction and a plurality of second projected dicing lines extending in a second direction that lies transversely to the first direction, the workpiece also having a body of metal disposed in superposed relation to the projected dicing lines, comprising:
   a tape sticking step of sticking a tape to the workpiece;
   after the tape sticking step is carried out, a holding step of holding the workpiece on a holding table with the tape interposed therebetween;
   after the holding step is carried out, a first cutting step of cutting the workpiece along the first projected dicing lines with the cutting blade while cutting into the tape, thereby to form first cut grooves in the workpiece;
   after the first cutting step is carried out, a second cutting step of cutting the workpiece along the second projected dicing lines with the cutting blade while cutting into the tape, thereby to form second cut grooves in the workpiece;
   after the second cutting step is carried out, a first metal burr removing step of moving the cutting blade through the first cut grooves while the cutting blade is positioned at such a height that a lowermost end of the cutting blade is lower than an upper end of the body of metal, thereby to remove metal burrs from the first cut grooves; and
   after the second cutting step is carried out, a second metal burr removing step of moving the cutting blade through the second cut grooves while the cutting blade is positioned at such a height that the lowermost end of the cutting blade is lower than the upper end of the body of metal, thereby to remove metal burrs from the second cut grooves,
   wherein a liquid containing an organic acid and an oxidizing agent is supplied to the workpiece in the first metal burr removing step and the second metal burr removing step.

2. The method of processing a workpiece according to claim 1, further comprising:
   after the first metal burr removing step and the second metal burr removing step are carried out, a first tape burr removing step of moving the cutting blade through the first cut grooves thereby to remove tape burrs produced from the tape; and
   after the first metal burr removing step and the second metal burr removing step are carried out, a second tape burr removing step of moving the cutting blade through the second cut grooves thereby to remove tape burrs produced from the tape,
   wherein in the first cutting step, the second cutting step, the first metal burr removing step, and the second metal burr removing step, a direction in which a lowermost end of the cutting blade upon rotation thereof is in agreement with a direction in which the workpiece is fed, and
   in the first tape burr removing step and the second tape burr removing step, the direction in which the lowermost end of the cutting blade upon rotation thereof is opposite the direction in which the workpiece is fed.

3. The method of processing a workpiece according to claim 1, wherein the workpiece is fed at a higher rate in the first metal burr removing step and the second metal burr removing step, than in the first cutting step and the second cutting step.

4. The method of processing a workpiece according to claim 1,
wherein a liquid containing an organic acid and an oxidizing agent is supplied to the workpiece in the first cutting step and the second cutting step.

* * * * *